(12) United States Patent
Xu et al.

(10) Patent No.: US 10,049,873 B2
(45) Date of Patent: Aug. 14, 2018

(54) PREPARATION METHODS OF LOW TEMPERATURE POLY-SILICON THIN FILM AND TRANSISTOR AND LASER CRYSTALLIZATION APPARATUS

(71) Applicant: BOE Technology Group Co., Ltd., Beijing (CN)

(72) Inventors: Xiaowei Xu, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/228,140

(22) Filed: Aug. 4, 2016

(65) Prior Publication Data
US 2017/0207086 A1    Jul. 20, 2017

(30) Foreign Application Priority Data

Jan. 14, 2016   (CN) .......................... 2016 1 0023998

(51) Int. Cl.
*H01L 21/02*  (2006.01)
*H01L 21/67*  (2006.01)
(Continued)

(52) U.S. Cl.
CPC ........ *H01L 21/02675* (2013.01); *B23K 26/00* (2013.01); *H01L 21/0217* (2013.01);
(Continued)

(58) Field of Classification Search
None
See application file for complete search history.

(56) References Cited

U.S. PATENT DOCUMENTS

2004/0082090 A1    4/2004  Hatano et al.
2004/0252738 A1    12/2004 Hill
(Continued)

FOREIGN PATENT DOCUMENTS

CA    2 513 574 A1     8/2004
CN    101295679 A      10/2008
(Continued)

OTHER PUBLICATIONS

First Office Action, including Search Report, for Chinese Patent Application No. 201610023998.6, dated Aug. 9, 2016, 17 pages.
(Continued)

*Primary Examiner* — Alexander Ghyka
(74) *Attorney, Agent, or Firm* — Westman, Champlin & Koehler, P.A.

(57) ABSTRACT

The invention provides a preparation method of a low temperature poly-silicon thin film, a preparation method of a low temperature poly-silicon thin film transistor, and a laser crystallization apparatus, and belongs to the technical field of display. The preparation method of a low temperature poly-silicon thin film of the invention comprises: forming an amorphous silicon thin film on a transparent substrate; and performing laser annealing on said amorphous silicon thin film from a side of said amorphous silicon thin film departing from said substrate, and performing laser irradiation from a side of said substrate departing from said amorphous silicon thin film, to form a low temperature poly-silicon thin film. The preparation method of a low temperature poly-silicon thin film of the invention may not only perform laser annealing on an amorphous silicon thin film form a side of the amorphous silicon thin film departing from the substrate, but also perform laser irradiation from a side of the substrate departing from the amorphous silicon thin film, and the temperature of the amorphous silicon thin (Continued)

film can be retained by performing laser irradiation from a side of the substrate departing from the amorphous silicon thin film. In this way, the crystallization period of polysilicon may be elongated, and it is possible to obtain crystal grains with larger sizes, to increase carrier mobility, and to reduce drain current.

13 Claims, 3 Drawing Sheets

(51) Int. Cl.
*H01L 29/66* (2006.01)
*H01L 29/786* (2006.01)
*B23K 26/00* (2014.01)

(52) U.S. Cl.
CPC .. *H01L 21/02164* (2013.01); *H01L 21/02422* (2013.01); *H01L 21/02488* (2013.01); *H01L 21/02502* (2013.01); *H01L 21/02532* (2013.01); *H01L 21/02686* (2013.01); *H01L 21/02691* (2013.01); *H01L 29/6675* (2013.01); *H01L 29/78672* (2013.01)

(56) References Cited

U.S. PATENT DOCUMENTS

2014/0057419 A1    2/2014  Tian et al.
2014/0141579 A1*   5/2014  Tian ..................... C30B 13/24
                                                    438/166

FOREIGN PATENT DOCUMENTS

| CN | 102651311 A | 8/2012 |
| CN | 102655089 A | 9/2012 |
| CN | 104282539 A | 1/2015 |
| CN | 104392913 A | 3/2015 |

OTHER PUBLICATIONS

Second Office Action, including Search Report, for Chinese Patent Application No. 201610023998.6, dated Feb. 3, 2017, 18 pages.
Third Office Action from Chinese Patent Application No. 201610023998.6, dated Sep. 22, 2017, 21 pages.
Rejection Decision from Chinese Patent Application No. 201610023998.6, dated Sep. 5, 2017, 23 pages.

* cited by examiner

PREPARATION METHODS OF LOW TEMPERATURE POLY-SILICON THIN FILM AND TRANSISTOR AND LASER CRYSTALLIZATION APPARATUS

CROSS-REFERENCE TO RELATED APPLICATION

This application claims the benefit of the Chinese Patent Application No. 201610023998.6, tilted "PREPARATION METHODS OF LOW TEMPERATURE POLY-SILICON THIN FILM AND TRANSISTOR AND LASER CRYSTALLIZATION APPARATUS" filed on Jan. 14, 2016 in the State Intellectual Property Office of China, the whole disclosure of which is incorporated herein by reference.

TECHNICAL FIELD

The invention belongs to the technical field of display, and in particular relates to a preparation method of a low temperature poly-silicon thin film, a preparation method of a low temperature poly-silicon thin film transistor, and a laser crystallization apparatus.

BACKGROUND ART

With the development of display technology, the demand for image quality of display is increasing, and the demand for flat panel display apparatuses with high image quality and high resolution becomes more and more common and more and more attracts the attention of display panel manufacturers.

A thin film transistor (simply referred to as TFT) is a main driving device in a flat display panel. A low temperature poly-silicon (simply referred to as LTPS) has a relatively high mobility and stability, and its mobility may be up to tens or hundreds of times that of amorphous silicon. Therefore, techniques of forming thin film transistors with low temperature poly-silicon materials have been rapidly developed.

Low-temperature poly-silicon thin films (i.e., active layers) in low temperature poly-silicon thin film transistors (LTPS TFT) are typically formed by performing a process of excimer laser annealing (ELA) on amorphous silicon thin films. In the process of laser annealing, non-uniform crystal grain sizes of poly-silicon and large roughness on the surface of poly-silicon thin films may be caused, leading to bad uniformities of threshold voltages and mobilities of low temperature poly-silicon thin film transistors. In particular, when the size of a transistor reduces, the problem of non-uniform threshold voltages will become severer. Furthermore, a typical method is sequentially preparing a silicon nitride layer and a silicon oxide layer as buffering layers on a glass substrate, then depositing an amorphous silicon thin film, and then irradiating the amorphous silicon thin film with excimer laser having a wavelength of 308 nm. In the process of the conversion of amorphous silicon to poly-silicon, the crystal grain size is directly determined by the crystallization period, and thus a relatively thick buffering layer is required to achieve the object of temperature retention. At present, it has been proposed that a glass substrate is heated to elongate the crystallization period. However, the heat resistance of the glass substrate and a relatively thick heat insulating layer between a heating table and amorphous silicon (glass substrate and buffering layer) limit the temperature of the heating and the performance There is still the need for methods and apparatuses for obtaining better low temperature poly-silicon thin films.

SUMMARY OF THE INVENTION

One embodiment of the invention provides a preparation method of a low temperature poly-silicon thin film, comprising steps of:

forming an amorphous silicon thin film on a transparent substrate; and performing laser annealing on said amorphous silicon thin film from a side of said amorphous silicon thin film departing from said substrate, and performing laser irradiation from a side of said substrate departing from said amorphous silicon thin film, to form a low temperature poly-silicon thin film.

Preferably, said performing laser annealing on said amorphous silicon thin film from a side of said amorphous silicon thin film departing from said substrate is prior to performing laser irradiation from a side of said substrate departing from said amorphous silicon thin film.

Preferably, an excimer laser is used for performing laser annealing on said amorphous silicon thin film from a side of said amorphous silicon thin film departing from said substrate.

Preferably, a solid laser is used for performing laser irradiation from a side of said substrate departing from said amorphous silicon thin film.

Preferably, in the step of performing laser annealing on said amorphous silicon thin film from a side of said amorphous silicon thin film departing from said substrate, said laser has a wavelength of 308 nm, an energy density of 300 to 500 mJ/cm$^2$, an optical pulse frequency of 300 to 500 Hz, an overlap ratio of 92% to 98%, and a scanning speed of 4 to 16 mm/s.

Preferably, in the step of performing laser irradiation from a side of said substrate departing from said amorphous silicon thin film, said laser has a wavelength of 308 to 1062 nm and an energy density of 10 to 200 mJ/cm$^2$.

Preferably, before said forming an amorphous silicon thin film on a substrate, it further comprises:

a step of forming a buffering layer on a substrate.

Further preferably, said buffering layer at least comprises at least one layer structure selected from a silicon oxide layer and a silicon nitride layer.

Further preferably, said buffering layer comprises a double-layer structure of a silicon oxide layer and a silicon nitride layer; wherein said silicon nitride layer has a thickness of 40 to 100 nm and said silicon oxide layer has a thickness of 100 to 300 nm.

Preferably, said amorphous silicon thin film has a thickness of 400 to 600 nm.

Preferably, said performing laser annealing on said amorphous silicon thin film from a side of said amorphous silicon thin film departing from said substrate and said performing laser irradiation from a side of said substrate departing from said amorphous silicon thin film are carried out in a scanning manner of the same scanning speed, and there is a delay of 0.1 to 1 s between said laser annealing and said laser irradiation at the same position on the thin film.

Another embodiment of the invention provides a preparation method of a low temperature poly-silicon thin film transistor, comprising the above preparation method of a low temperature poly-silicon thin film.

Still another embodiment of the invention provides a preparation method of a low temperature poly-silicon thin film transistor, comprising a step of an active layer, wherein the step of forming said active layer specifically comprises:

forming an amorphous silicon thin film on a transparent substrate;

performing laser annealing on said amorphous silicon thin film from a side of said amorphous silicon thin film departing from said substrate and performing laser irradiation from a side of said substrate departing from said amorphous silicon thin film to form a low temperature poly-silicon thin film; and performing a patterning process on the low temperature poly-silicon thin film to form a pattern comprising an active layer.

Preferably, said performing laser annealing on said amorphous silicon thin film from a side of said amorphous silicon thin film departing from said substrate is prior to performing laser irradiation from a side of said substrate departing from said amorphous silicon thin film.

Preferably, before said forming an amorphous silicon thin film on a substrate, it further comprises:

a step of forming a buffering layer on a substrate.

Still another embodiment of the invention provides a laser crystallization apparatus, comprising:

a working chamber;

a supporting table, which is provided in said working chamber and is used for supporting a substrate formed with an amorphous silicon thin film;

a first laser, which is used for performing laser annealing on said amorphous silicon thin film from a side of said amorphous silicon thin film departing from said substrate;

a second laser, which is used for performing laser irradiation from a side of said substrate departing from said amorphous silicon thin film.

Preferably, said first laser is an excimer laser; and said second laser is a solid laser.

Figure 1:
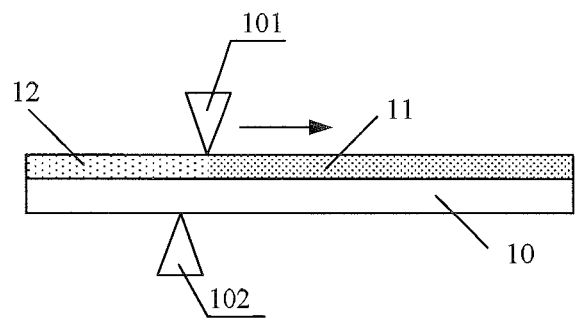
FIG. 1 is a schematic diagram of the preparation method of the low temperature poly-silicon thin film in Example 1 of the invention.

Here, the reference numerals are as follows: 10, substrate; 11, amorphous silicon thin film; 12, low temperature poly-silicon thin film; 1, first laser; 2, second laser; 3, working chamber; 4, supporting table; 101, first laser beam; 102, second laser beam.

DESCRIPTION OF EMBODIMENTS

The preparation method of a low temperature poly-silicon thin film according to the embodiment of the invention may not only perform laser annealing on an amorphous silicon thin film form a side of the amorphous silicon thin film departing from the substrate, but also perform laser irradiation from a side of the substrate departing from the amorphous silicon thin film, and the temperature of the amorphous silicon thin film can be retained by performing laser irradiation from a side of the substrate departing from the amorphous silicon thin film. In this way, in comparison with single-side laser annealing, the crystallization period of poly-silicon may be elongated, and it is possible to obtain crystal grains with larger sizes, to increase carrier mobility, and to reduce drain current. Also, when silicon nitride and/or silicon oxide buffering layers are present, the buffering layer may be relatively thin.

In order to allow the person skilled in the art to better understand the technical solution of the invention, the invention will be further described in detail in conjunction with accompanying drawings and specific embodiments.

Example 1

Figure 2:
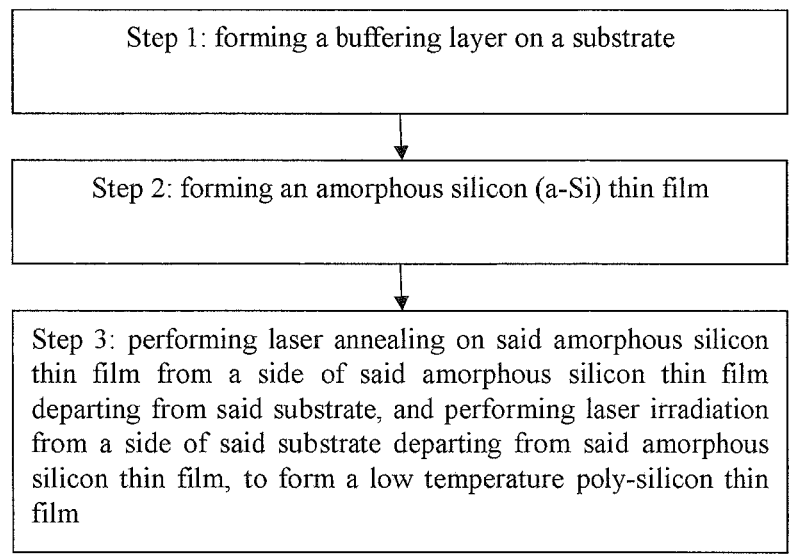
FIG. 2 is a flow chart of the preparation method of the low temperature poly-silicon thin film in Example 1 of the invention.

In conjunction with FIGS. 1 and 2, this Example provides a preparation method of a low temperature poly-silicon thin film 12, comprising steps of:

Step 1, forming a buffering layer (not shown) on a substrate 10.

In this step, the substrate 10 is produced from transparent materials such as glass, etc., and is preliminarily cleaned. Particularly, the buffering layer is formed on the substrate 10 in a manner of sputtering, thermal evaporation, plasma enhanced chemical vapor deposition (simply referred to as PECVD), low pressure chemical vapor deposition (simply referred to as LPCVD), atmospheric pressure chemical vapor deposition (simply referred to as APCVD), or electron cyclotron resonance chemical vapor deposition (simply referred to as ECR-CVD).

Here, the buffering layer at least comprises at least one layer structure selected from silicon oxide and silicon nitride, with a thickness of 140 nm to 400 nm. Preferably, the buffering layer comprises a double-layer structure of a silicon oxide layer and a silicon nitride layer; wherein said silicon nitride layer has a thickness of 40 to 100 nm and said silicon oxide layer has a thickness of 100 to 300 nm.

In this Example, a buffering layer is prepared, and the reason thereof is to form an effective thermal blocking layer, such that amorphous silicon is fully crystallized to form poly-silicon in subsequent steps.

Step 2, forming an amorphous silicon thin film 11 (a-Si) on the substrate 10 after finishing the above step.

In this step, the manners in which the amorphous silicon thin film 11 is formed include a plasma enhanced chemical vapor deposition manner and a low pressure chemical vapor deposition manner. The amorphous silicon thin film 11 has a thickness of 400 to 600 nm.

Step 3, performing laser annealing on a side of the amorphous silicon thin film 11 departing from the substrate 10, and performing laser irradiation on a side of the substrate 10 departing from the amorphous silicon thin film 11, to form a low temperature poly-silicon thin film 12.

This step specifically comprises the steps as follows. First, a first laser beam 101 emitted by an excimer laser is used for performing laser annealing on the amorphous silicon thin film from a side of the amorphous silicon thin film 11 departing from the substrate 10; wherein the laser emitted by the excimer laser has a wavelength of 308 nm, an energy density of 300 to 500 mJ/cm$^2$, an optical pulse frequency of 300 to 500 Hz, an overlap ratio of 92% to 98%, and a scanning speed of 4 to 16 mm/s.

With a delay of 0.1 s to 1 s after performing laser annealing on the amorphous silicon thin film from a side of the amorphous silicon thin film 11 departing from the substrate 10, a solid laser begins to be used to emit a second laser beam 102 for performing laser irradiation on a side of the substrate 10 departing from the amorphous silicon thin film 11, so that the distance between the first laser beam 101 and the second laser beam 102 in horizontal direction is 300 µm to 10 mm. As for the requirement for this distance, two lasers are provided on different sides in this Example. In this way, the lasers are not limited by volume, which more facilitates laser scanning on different sides, and thus the range of the crystal size can be more precisely controlled. Here, the laser emitted by the solid laser has a wavelength of 308 to 1062 nm and an energy density of 10 to 200 mJ/cm$^2$.

A poly-silicon thin film is finally formed.

In this Example, laser annealing is first performed on the amorphous silicon thin film from a side of the amorphous silicon thin film 11 departing from the substrate 10, and laser irradiation is performed from a side of the substrate 10 departing from the amorphous silicon thin film 11. The reason thereof is that the purpose of performing laser irradiation from a side of the substrate 10 departing from the amorphous silicon thin film 11 is to retain the temperature of the amorphous silicon thin film 11. In this way, the crystallization period of poly-silicon may be elongated, and it is possible to obtain crystal grains with larger sizes, to increase carrier mobility, and to reduce drain current. Also, due to the addition of the step of performing laser irradiation from a side of the substrate 10 departing from the amorphous silicon thin film 11, the thickness of the buffering layer in this Example may be thinner than that in the prior art.

Example 2

Figure 3:
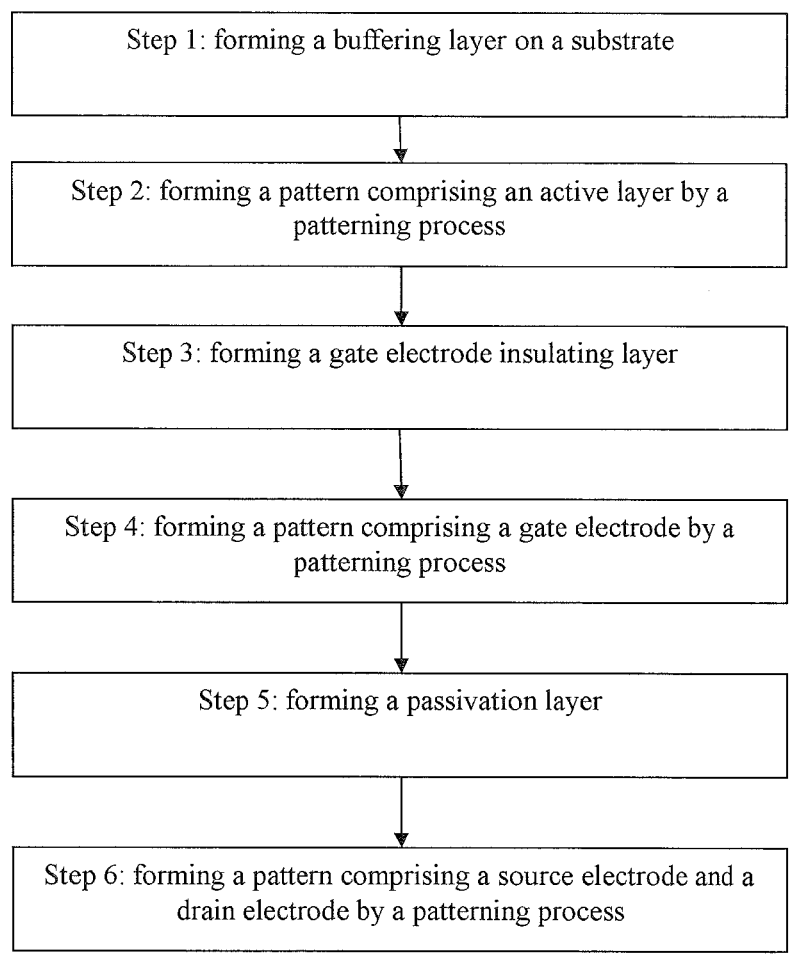
FIG. 3 is a flow chart of the preparation method of the low temperature poly-silicon thin film transistor in Example 2 of the invention.

As shown in FIG. 3, this Example provides a preparation method of a low temperature poly-silicon thin film transistor, comprising the step of preparing the low temperature poly-silicon thin film 12 in Example 1. Particularly, description is made by exemplifying the preparation of a top gate type transistor.

Step 1, forming a buffering layer on a substrate 10.

In this step, the substrate 10 is produced from transparent materials such as glass, etc., and is preliminarily cleaned. Particularly, the buffering layer is formed on the substrate 10 in a manner of sputtering, thermal evaporation, plasma enhanced chemical vapor deposition, low pressure chemical vapor deposition, atmospheric pressure chemical vapor deposition, or electron cyclotron resonance chemical vapor deposition.

Here, the buffering layer at least comprises at least one layer structure selected from silicon oxide and silicon nitride, with a thickness of 140 nm to 400 nm. Preferably, the buffering layer comprises a double-layer structure of a silicon oxide layer and a silicon nitride layer; wherein said silicon nitride layer has a thickness of 40 to 100 nm and said silicon oxide layer has a thickness of 100 to 300 nm.

In this Example, a buffering layer is prepared, and the reason thereof is to form an effective thermal blocking layer, such that amorphous silicon is fully crystallized to form poly-silicon in subsequent steps.

Step 2, forming a pattern comprising an active layer by a patterning process on the substrate 10 after finishing the above step.

Figure 4:
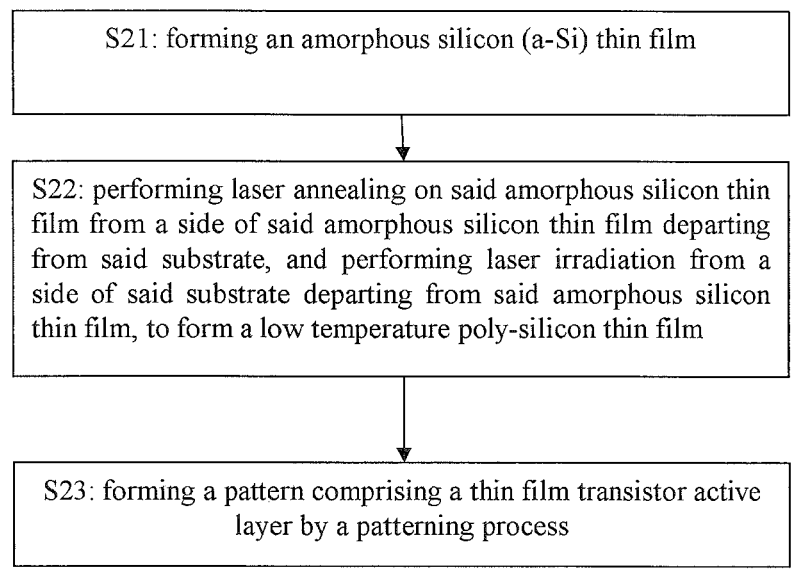
FIG. 4 is a flow chart of Step 2 of the preparation method of the low temperature poly-silicon thin film transistor in Example 2 of the invention.

As shown in FIG. 4, this step specifically comprises:

S21, forming an amorphous silicon thin film 11 (a-Si). The manners in which the amorphous silicon thin film 11 is formed include a plasma enhanced chemical vapor deposition manner and a low pressure chemical vapor deposition manner. The amorphous silicon thin film 11 has a thickness of 400 to 600 nm.

S22, performing laser annealing on the amorphous silicon thin film from a side of the amorphous silicon thin film 11 departing from the substrate 10, and performing laser irradiation from a side of the substrate 10 departing from the amorphous silicon thin film 11, to form a low temperature poly-silicon thin film 12.

Step S22 specifically comprises the steps as follows. First, an excimer laser is used to emit a first laser beam 101 for performing laser annealing on the amorphous silicon thin film from a side of the amorphous silicon thin film 11 departing from the substrate 10; wherein the laser emitted by the excimer laser has a wavelength of 308 nm, an energy density of 300 to 500 mJ/cm$^2$, an optical pulse frequency of 300 to 500 Hz, an overlap ratio of 92% to 98%, and a scanning speed of 4 to 16 mm/s.

With a delay of 0.1 s to 1 s after performing laser annealing on the amorphous silicon thin film from a side of the amorphous silicon thin film 11 departing from the substrate 10, a solid laser begins to be used to emit a second laser beam 102 for performing laser irradiation on a side of the substrate 10 departing from the amorphous silicon thin film 11, so that the distance between the first laser beam 101 and the second laser beam 102 in horizontal direction is 300 µm to 10 mm. As for the requirement for this distance, two lasers are provided on different sides in this Example. In this way, the lasers are not limited by volume, which more facilitates laser scanning on different sides, and thus the range of the crystal size can be more precisely controlled. Here, the laser emitted by the solid laser has a wavelength of 308 to 1062 nm and an energy density of 10 to 200 mJ/cm$^2$.

S23, forming a pattern comprising a thin film transistor active layer by a patterning process.

Step 3, forming a gate electrode insulating layer.

In this step, the gate electrode insulating layer is formed by preparation methods such as thermal growth, normal pressure chemical vapor deposition, low pressure chemical vapor deposition, plasma-assisted chemical vapor deposition, sputtering, etc.

Step 4, forming a pattern comprising a gate electrode by a patterning process.

In this step, a gate metal thin film is formed in a manner of sputtering, thermal evaporation, plasma enhanced chemical vapor deposition, low pressure chemical vapor deposition, atmospheric pressure chemical vapor deposition, or electron cyclotron resonance chemical vapor deposition, and this gate metal thin film is subjected to photoresist coating, exposure, development, etching, photoresist peeling, to form a pattern comprising a thin film transistor gate electrode.

Step 5, forming a passivation layer, and etching the passivation layer and the gate electrode insulating layer to form through holes corresponding to a source electrode contact area and a drain electrode contact area.

In this step, the passivation layer is formed by preparation methods such as thermal growth, normal pressure chemical vapor deposition, low pressure chemical vapor deposition, plasma-assisted chemical vapor deposition, sputtering, etc., and through holes, which penetrate the passivation layer and the gate electrode insulating layer and correspond to a source electrode contact area and a drain electrode contact area, are formed by an etching process.

Step 6, forming a pattern comprising a source electrode and a drain electrode by a patterning process.

Specifically, this step is as follows. Source and drain metal thin films are formed in a manner of sputtering, thermal evaporation, plasma enhanced chemical vapor deposition, low pressure chemical vapor deposition, atmospheric pressure chemical vapor deposition, or electron cyclotron resonance chemical vapor deposition. The source and drain metal thin films are subjected to photoresist coating, exposure, development, etching, photoresist peeling, to form a pattern comprising a source electrode and a drain electrode. The source electrode and the drain electrode are in contact with the source electrode contact area and the drain electrode contact area of the active layer through corresponding through holes, respectively.

By far, the preparation of the low temperature poly-silicon thin film transistor is achieved.

Example 3

Figure 5:
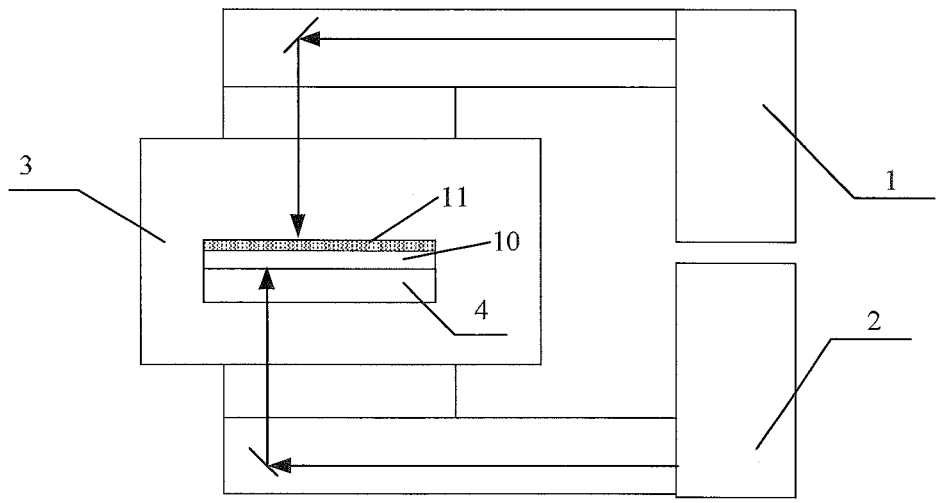
FIG. 5 is a structural schematic diagram of the laser crystallization apparatus in Example 3 of the invention.

As shown in FIG. 5, this Example provides a laser crystallization apparatus, which can be used in the preparation of the low temperature poly-silicon thin films 12 in Examples 1 and 2. The laser crystallization apparatus of this Example specifically comprises: a working chamber 3, a supporting table 4, a first laser 1, and a second laser 2; wherein the supporting table 4 is provided in the working chamber 3 and is used for supporting a substrate 10 formed with an amorphous silicon thin film 11; the first laser 1 is used for performing laser annealing on an amorphous silicon thin film from a side of the amorphous silicon thin film 11 departing from said substrate 10; the second laser 2 is used for performing laser irradiation from a side of the substrate 10 departing from the amorphous silicon thin film 11.

Here, the first laser 1 described above is preferably an excimer laser; the second laser 2 described above is preferably a solid laser.

The use of the laser crystallization apparatus of this Example may not only perform laser annealing on an amorphous silicon thin film form a side of the amorphous silicon thin film 11 departing from the substrate 10, but also perform laser irradiation from a side of the substrate 10 departing from the amorphous silicon thin film 11, and the temperature of the amorphous silicon thin film 11 can be retained by performing laser irradiation on a side of the substrate 10 departing from the amorphous silicon thin film 11. In this way, the crystallization period of poly-silicon may be elongated, and it is possible to obtain crystal grains with larger sizes, to increase carrier mobility, and to reduce drain current.

It can be understood that the above embodiments are merely exemplary embodiments used for illustrating the principle of the invention. However, the invention is not limited thereto. With respect to those of ordinary skill in the art, various variations and modifications can be made without departing from the spirit and the substance of the invention. These variations and modifications are also considered as the scope protected by the invention.

What is claimed is:

1. A preparation method of a low temperature poly-silicon thin film, comprising steps of:
    forming an amorphous silicon thin film on a transparent substrate; and
    at a location of the amorphous silicon thin film, performing laser annealing on said amorphous silicon thin film from a side of said amorphous silicon thin film departing from said substrate, so that at least a portion of the amorphous silicon thin film at said location begins to transform into a polycrystalline silicon;
    after the transformation starts, performing laser irradiation from a side of said substrate departing from said amorphous silicon thin film at said location, and continuously performing the laser irradiation after the laser in said laser in said laser annealing has been removed at said location, so as to retain a temperature of the thin film at said location, to form a low temperature poly-silicon thin film,
    wherein the laser irradiation has an energy density level lower than that of the laser annealing.

2. The preparation method of a low temperature poly-silicon thin film according to claim 1, wherein an excimer laser is used for performing laser annealing on said amorphous silicon thin film from a side of said amorphous silicon thin film departing from said substrate.

3. The preparation method of a low temperature poly-silicon thin film according to claim 1, wherein a solid laser is used for performing laser irradiation from a side of said substrate departing from said amorphous silicon thin film.

4. The preparation method of a low temperature poly-silicon thin film according to claim 1, wherein in the step of performing laser annealing on said amorphous silicon thin film from a side of said amorphous silicon thin film departing from said substrate, said laser has a wavelength of 308 nm, an energy density of 300 to 500 mJ/cm$^2$, an optical pulse frequency of 300 to 500 Hz, an overlap ratio of 92% to 98%, and a scanning speed of 4 to 16 mm/s.

5. The preparation method of a low temperature poly-silicon thin film according to claim 1, wherein in the step of performing laser irradiation from a side of said substrate departing from said amorphous silicon thin film, said laser has a wavelength of 308 to 1062nm and an energy density of 10 to 200 mJ/cm$^2$.

6. The preparation method of a low temperature poly-silicon thin film according to claim 1, wherein before said forming an amorphous silicon thin film on a transparent substrate, it further comprises:
    a step of forming a buffering layer on a substrate.

7. The preparation method of a low temperature poly-silicon thin film according to claim 6, wherein said buffering layer at least comprises at least one layer structure selected from a silicon oxide layer and a silicon nitride layer.

8. The preparation method of a low temperature poly-silicon thin film according to claim 7, wherein said buffering layer comprises a double-layer structure of a silicon oxide layer and a silicon nitride layer; wherein said silicon nitride layer has a thickness of 40 to 100 nm and said silicon oxide layer has a thickness of 100 to 300 nm.

9. The preparation method of a low temperature poly-silicon thin film according to claim 1, wherein said amorphous silicon thin film has a thickness of 400 to 600 nm.

10. The preparation method of a low temperature poly-silicon thin film according to claim 1, wherein said performing laser annealing on said amorphous silicon thin film from a side of said amorphous silicon thin film departing from said substrate and said performing laser irradiation from a side of said substrate departing from said amorphous silicon thin film are carried out in a scanning manner of the same scanning speed, and there is a delay of 0.1 to 1 s between said laser annealing and said laser irradiation at the same position on the thin film.

11. A preparation method of a low temperature poly-silicon thin film transistor, comprising the preparation method of a low temperature poly-silicon thin film of claim 1.

12. The preparation method of a poly-silicon thin film transistor according to claim 10, comprising a step of forming an active layer, wherein the step of forming said active layer specifically comprises:

preparing a low temperature poly-silicon thin film according to the method of claim 1; and performing a patterning process on the low temperature poly-silicon thin film to form a pattern comprising an active layer.

13. The preparation method of a poly-silicon thin film transistor according to claim 12, wherein before said forming an amorphous silicon thin film on a substrate, it further comprises:

a step of forming a buffering layer on the substrate.

* * * * *